(12) United States Patent
Xu et al.

(10) Patent No.: US 11,646,300 B2
(45) Date of Patent: May 9, 2023

(54) DOUBLE COLOR MICRO LED DISPLAY PANEL

(71) Applicant: HONG KONG BEIDA JADE BIRD DISPLAY LIMITED, Hong Kong (HK)

(72) Inventors: Quchao Xu, Hong Kong (HK); Qiming Li, Hong Kong (HK)

(73) Assignee: Jade Bird Display (Shanghai) Limited, Shanghai (CN)

( * ) Notice: Subject to any disclaimer, the term of this patent is extended or adjusted under 35 U.S.C. 154(b) by 276 days.

(21) Appl. No.: 17/008,815

(22) Filed: Sep. 1, 2020

(65) Prior Publication Data
US 2022/0068898 A1 Mar. 3, 2022

(51) Int. Cl.
| | | |
|---|---|---|
| *H01L 25/16* | (2006.01) | |
| *H01L 33/62* | (2010.01) | |
| *H01L 33/52* | (2010.01) | |
| *H01L 33/60* | (2010.01) | |
| *H01L 23/00* | (2006.01) | |

(52) U.S. Cl.
CPC ............ *H01L 25/167* (2013.01); *H01L 24/29* (2013.01); *H01L 24/32* (2013.01); *H01L 24/33* (2013.01); *H01L 33/52* (2013.01); *H01L 33/60* (2013.01); *H01L 33/62* (2013.01); *H01L 2224/29186* (2013.01); *H01L 2224/32145* (2013.01); *H01L 2224/32227* (2013.01)

(58) Field of Classification Search
CPC ....... H01L 33/52; H01L 25/167; H01L 33/62; H01L 27/156; H01L 24/29; H01L 25/0753; H01L 24/33; H01L 33/60; H01L 24/32; H01L 33/58; H01L 33/504; H01L 27/15; H01L 33/382; H01L 33/08; H01L 33/50; H01L 25/0756; H01L 33/38; H01L 33/44; H01L 33/387; H01L 33/0095; H01L 27/153; H01L 33/405; H01L 25/13; H01L 33/505; H01L 33/0093; H01L 33/20
USPC ............... 257/79, E25.021, E33.072, E25.02
See application file for complete search history.

(56) References Cited

U.S. PATENT DOCUMENTS

| | | | | |
|---|---|---|---|---|
| 6,100,103 | A  * | 8/2000 | Shim ....................... | H01L 27/15 438/455 |
| 2005/0012465 | A1* | 1/2005 | Uchida ................... | B32B 27/00 315/169.3 |
| 2007/0029941 | A1* | 2/2007 | Ito ......................... | H01L 27/3209 313/503 |
| 2010/0321420 | A1* | 12/2010 | Ohtani ................. | H01L 27/3209 345/690 |

(Continued)

*Primary Examiner* — Mouloucoulaye Inoussa
(74) *Attorney, Agent, or Firm* — Rosenberg, Klein & Lee

(57) ABSTRACT

The present invention discloses a double color micro LED display panel including a plurality of pixels and a plurality of barrier components. Each of the pixels includes a substrate, a first bonding layer configured on the substrate, a first light emitting layer configured on the first bonding layer and emitting a first light, a second bonding layer configured on the first light emitting layer and a second light emitting layer configured on the second bonding layer and emitting a second light. The wavelength of the second light is different from that of the first light. The barrier components respectively located between the pixels for blocking a light emitted from one of the pixels to the other of the pixels. Wherein, the material of the second bonding layer is a non-metallic material.

14 Claims, 7 Drawing Sheets

(56) References Cited

U.S. PATENT DOCUMENTS

| | | | |
|---|---|---|---|
| 2013/0001612 A1* | 1/2013 | Lee | H01L 27/3211 |
| | | | 257/40 |
| 2014/0342483 A1* | 11/2014 | Liu | H01L 27/3206 |
| | | | 438/34 |
| 2016/0260791 A1* | 9/2016 | Fleissner | H01L 27/3216 |
| 2016/0315283 A1* | 10/2016 | Kim | H01L 27/3293 |
| 2017/0104035 A1* | 4/2017 | Lee | H01L 51/0023 |
| 2017/0263178 A1* | 9/2017 | Bae | H01L 25/0753 |
| 2019/0058143 A1* | 2/2019 | Park | H01L 27/302 |
| 2019/0164944 A1* | 5/2019 | Chae | H01L 25/13 |
| 2019/0165037 A1* | 5/2019 | Chae | H01L 25/13 |
| 2019/0165038 A1* | 5/2019 | Chae | H01L 33/405 |
| 2019/0165207 A1* | 5/2019 | Kim | H01L 33/385 |
| 2019/0189596 A1* | 6/2019 | Chae | H01L 33/08 |
| 2019/0189681 A1* | 6/2019 | Chae | H01L 27/153 |
| 2019/0206849 A1* | 7/2019 | Jang | H01L 33/38 |
| 2019/0206927 A1* | 7/2019 | Lee | H01L 27/153 |
| 2019/0214373 A1* | 7/2019 | Kim | H01L 33/62 |
| 2019/0267436 A1* | 8/2019 | Zhang | H01L 27/1259 |
| 2020/0212262 A1* | 7/2020 | Jang | H01L 33/62 |
| 2020/0251613 A1* | 8/2020 | Yang | H01L 33/44 |
| 2020/0365647 A1* | 11/2020 | Jang | H01L 33/44 |
| 2020/0365648 A1* | 11/2020 | Jang | H01L 33/0093 |
| 2021/0126043 A1* | 4/2021 | Lee | H01L 33/44 |

\* cited by examiner

DOUBLE COLOR MICRO LED DISPLAY PANEL

BACKGROUND OF THE INVENTION

1. Field of the Invention

The present invention relates to a micro LED display panel, and more particularly, to a double color micro LED display panel for increasing the light output rate and resolution.

2. Description of the Prior Art

In recent years, Mini LED and Micro LED technologies have been well developed, and LED panels are commonly applied to consumer devices and applications such as augmented reality (AR), projection, heads up display (HUD), and mobile device displays, wearable device displays, and automotive displays. With the improvement of people's quality of life, the devices and applications require LED panels with improved resolution and brightness. For example, an AR display integrated within a goggle and positioned close to a wearer's eyes can have a dimension of the fingernail while still demanding an HD definition (1280× 720 pixels) or higher.

With the requirement for miniaturization and portability of electronic devices, the size of the LED panels is also limited. It means that the size of each pixel of the LED panel is decreased when the LED panel has high resolution. When the size of the pixel is smaller, the light output area of the pixel is also decreased. Moreover, light is emitted in multiple directions, so the pixel can only emit part of the light, thereby reducing the light output rate. Furthermore, the distance among the pixels is also decreased when the bonding LED panel has high resolution. That is to say, the light emitted from one pixel is easier to transmit to another pixel of the LED panel to cause the light crosstalk, thereby decreasing the display efficiency.

In addition, it is increasingly important for a light emitting device to integrate a plurality of various types of light emitting transistors and multi-color light emitting pixel units. In the prior art, the multi-color light emitting pixel includes a plurality of light emitting regions for emitting different types of lights respectively. Because the aligning processes and transferring processes are complex, the conventional process of fabricating the different types of light emitting regions becomes increasingly difficult, thereby leading to problems such as decreased alignment accuracy, decreased yield, and increased cost.

Generally speaking, at least red, green and blue colors are superimposed to reproduce a broad array of colors. In some instances, the pixel includes three monochromatic LEDs emitting red, green and blue colors respectively, and the monochromatic LEDs are fabricated at different non-overlapping zones in the pixel. The existing technology faces the challenges to improve the effective emitting area within each pixel when the distance between the adjacent LEDs is determined. On the other hand, when a single LED emitting area is determined, further improving the overall resolution of the LED panel can be a difficult task because LEDs with different colors have to occupy their designated zones within the single pixel.

Thus, it is necessary to provide an LED structure for display panels to solve the above-mentioned drawbacks.

SUMMARY OF THE INVENTION

Therefore, the present invention is to provide a double color micro LED display panel including a plurality of pixels and a plurality of barrier components. Each of plurality of pixels includes a substrate, a first bonding layer, a first light emitting layer, a second bonding layer and a second light emitting layer. The first bonding layer is configured on the substrate. The first light emitting layer is configured on the first bonding layer and emits a first light. The second bonding layer is configured on the first light emitting layer. The second light emitting layer is configured on the second bonding layer and emits a second light. The wavelength of the second light is different from that of the first light. The plurality of barrier components are respectively located between the pixels for blocking a light emitted from one of the pixels to the other of the pixels. Wherein, the material of the second bonding layer is a non-metallic material.

Wherein, each of the pixels includes an insulation layer. The insulation layer covers the side wall of the first bonding layer, the first light emitting layer, the second bonding layer, the second light emitting layer, and the surface of the substrate. A portion of the second light emitting layer is exposed, and the insulation layer extends to the position between the pixels.

Wherein, each of the pixels includes a top conductive layer configured on the insulation layer and electrically connected to the exposed portion of the second light emitting layer. The top conductive layer extends to the position between the pixels, and the barrier component is configured on the top conductive layer.

Wherein, the double color micro LED display panel further includes a plurality of conductive pads respectively configured on the top conductive layer and located between the pixels, and the barrier component covers the conductive pad.

Wherein, the insulation layer further covers the barrier component.

Wherein, each of the pixels includes a top conductive layer configured on the insulation layer. The top conductive layer extends to the position between the pixels, and the top conductive layer is separated from the barrier component by the insulation layer.

Wherein, the double color micro LED display panel further includes a plurality of conductive pads respectively configured on the top conductive layer between the pixels and located above the barrier component.

Wherein, the barrier component has a reflective structure to reflect the first light emitted from the first light emitting layer to a certain direction.

Wherein, the barrier component has an optical isolation structure to baffle the first light emitted from the first light emitting layer.

Wherein, the second bonding layer is transparent. The first light emitted from the first light emitting layer propagates through the second bonding layer and the second light emitting layer.

Wherein, the double color micro LED display panel further includes a plurality of pixel drivers respectively configured on the substrate of the pixels. The first light emitting layer and the second light emitting layer are electrically connected to the pixel driver, and the pixel driver drives the first light emitting layer and the second light emitting layer to emit the first light and the second light respectively.

Wherein, each of pixels includes an anode pad and a cathode pad configured on the substrate. One side of the second light emitting layer is electrically connected to the anode pad of the substrate, and one side of the first light emitting layer is electrically connected to the cathode pad of the substrate.

Wherein, each of the pixels includes a first connecting structure connected with the upper part of the first light emitting layer and the substrate, and a second connecting structure connected with the bottom part of the second light emitting layer.

Wherein, each of the pixels includes an anode pad and a cathode pad configured on the substrate. The first bonding layer and the second connecting structure are electrically connected to the anode pad, and the first connecting structure is electrically connected to the cathode pad.

Wherein, the second connecting structure connects to the barrier component, and the barrier component electrically connects to the anode pad of the substrate.

Wherein, each of the pixels includes a first reflective layer configured between the first bonding layer and the first light emitting layer, and a second reflective layer configured between the second bonding layer and the second light emitting layer.

Wherein, the first light and the second light are selected from two of red, blue, yellow, green, orange, cyan and purple lights.

In summary, the double color micro LED display panel of the present invention can effectively block the light emitted from one pixel to another of pixels by the barrier component. The barrier component can be a reflective structure to increase the light output rate, which improves the display efficiency. The barrier component also can be an optical isolation structure to increase the resolution. The bonding layer between the light emitting layers can be transparent to increase the light output rate. Moreover, the pixel also can increase the light output rate by the reflective layer configured between the bonding layer and the light emitting layer.

BRIEF DESCRIPTION OF THE APPENDED DRAWINGS

DETAILED DESCRIPTION OF THE INVENTION

A detailed description of the hereinafter described embodiments of the disclosed apparatus and method are presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

Figure 1:
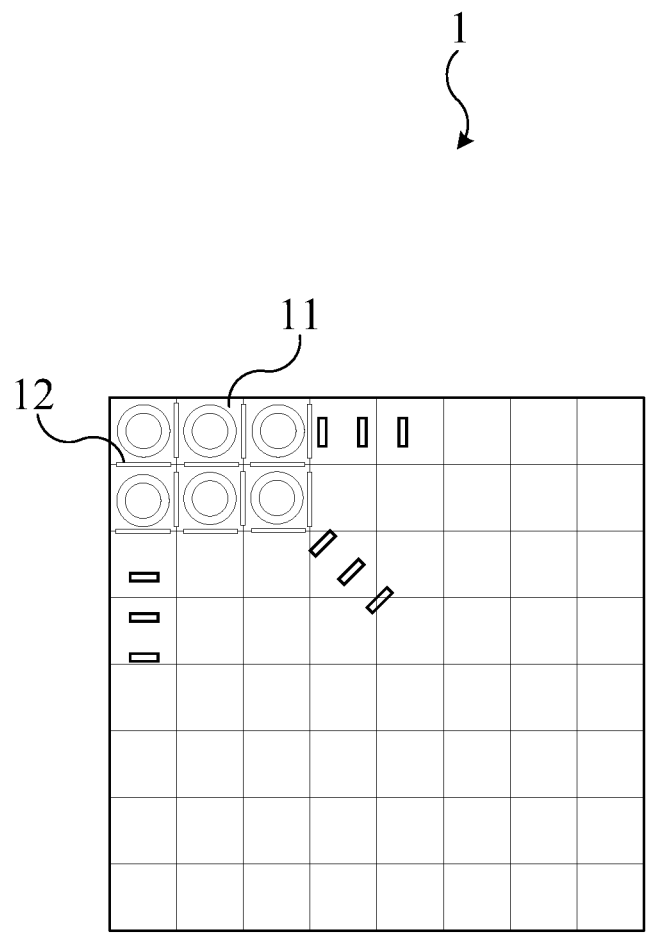
FIG. 1 is a schematic diagram illustrating a double color micro LED display panel according to an embodiment of the present invention.
Figure 2:
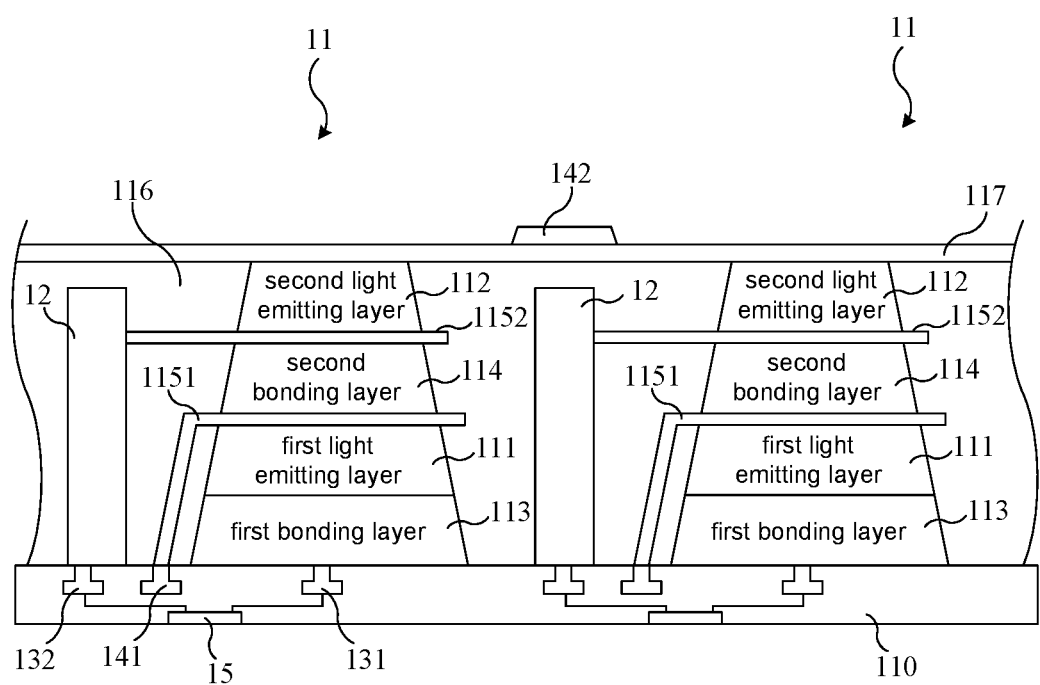
FIG. 2 is a cross-sectional diagram illustrating the two pixels of the double color micro LED display panel in FIG. 1.

Please refer to FIG. 1 and FIG. 2. FIG. 1 is a schematic diagram illustrating a double color micro LED display panel 1 according to an embodiment of the present invention. FIG. 2 is a cross-sectional diagram illustrating the two pixels 11 of the double color micro LED display panel 1 in FIG. 1. In this embodiment, the double color micro LED display panel 1 includes a plurality of pixels 11 and a plurality of barrier component 12. Each of barrier components 12 respectively located between two pixels 11. The pixel 11 includes a substrate 110, a first bonding layer 113, a first light emitting layer 111, a second bonding layer 114, and a second light emitting layer 112. The first bonding layer 113 is configured on the substrate 110. The first light emitting layer 111 is configured on the first bonding layer 113. The second bonding layer 114 is configured on the first light emitting layer 111. The second light emitting layer 112 is configured on the second bonding layer 114. The first light emitting layer 111 emits a first light, and the second light emitting layer 112 emits a second light. The wavelength of the second light is different from that of the first light. The barrier component 12 is configured to block the light emitted from one of the pixels to another of the pixels.

In practice, the double color micro LED display panel 1 can be applied to the screens of display devices. The plurality of pixels 11 of the double color micro LED display panel 1 can be arranged in an array. The first bonding layer 113, the first light emitting layer 111, the second bonding layer 114 and the second light emitting layer 112 are sequentially stacked on the substrate 110. For convenience, "top" means away from the substrate 110, "bottom" means toward the substrate 110, and the directional terms such as up, down, above, below, under etc. are interpreted accordingly. That is to say, the first bonding layer 113 is the bottom layer and the second light emitting layer 112 is the top layer of the pixel 11, the first light emitting layer 111 is stacked on the first bonding layer 113, and the second bonding layer 114 is stacked on the first light emitting layer 111. In this embodiment, the cross-sectional area of the first bonding layer 113, the first light emitting layer 111, the second bonding layer 114, and the second light emitting layer 112 decreases from the bottom layer to the top layer. In practice, the configuration of those layers of the pixel 11 will improve the electronic connections between the individual LED structures and the electrodes, which simplifies the fabrication process. For example, the lower layer is exposed from the upper layer for easy connection. The first bonding layer 113, the first light emitting layer 111, the second bonding layer 114 and the second light emitting layer 112 can be formed on the substrate 110 by chemical vapor deposition (CVD) or vapor phase epitaxy (VPE). It should be noted that "layer" described herein is not limited to a single layer but may include a plurality of sub layers. In some embodiments, a "structure" can take the form of a "layer".

In practice, the substrate 110 can be, but not limited to, a Si substrate, and the substrate 110 also can be a sapphire substrate, or a transparent substrate such as a glass substrate. The material of the substrate 110 also may be selected from one of InP, SiC and ZnO. The material of the first light emitting layer 111 and the second light emitting layer 112 can be GaN, GaP, GaAs, but it is not limited herein. The first light emitting layer 111 and the second light emitting layer 112 also can be at least one of a light emitting diode (LED), a Schottky LED, and so on. The first light emitted from the first light emitting layer 111 and the second light emitted from the second light emitting layer 112 can be selected from a range of different colors from a wavelength of 380 nm to 700 nm in visible color range. For example, the first light and the second light can be selected from two of red, blue, yellow, green, orange, cyan and purple lights. Moreover, the first light and the second light also can be selected from invisible ranges such as ultra-violet and infrared.

In one embodiment, the pixel only includes the substrate, the first light emitting layer, and the second light emitting layer. The first light emitting layer is configured on the substrate, and the second light emitting layer is configured on the first light emitting layer. Furthermore, the first light emitting layer includes a first P type semiconductor layer and a first N type semiconductor layer, and the second light emitting layer includes a second P type semiconductor layer and a second N type semiconductor layer. In practice, the first P type semiconductor layer can contact the second P type semiconductor layer, and the materials of the first P type semiconductor layer and the second P type semiconductor layer are the same. That is to say, the first light emitting layer and the second light emitting layer share the same P type semiconductor layer. In one embodiment, the positions of the P type semiconductor layer and the N type semiconductor layer of the first light emitting layer and the second light emitting layer can be exchanged, and the first light emitting layer and the second light emitting layer share the same N type semiconductor layer.

In this embodiment, the first bonding layer 113 is a metal layer, and the second bonding layer 114 is a non-metallic layer. Furthermore, the second bonding layer 114 is transparent. In practice, the material of the first bonding layer can comprise at least one selected from Au, Sn, In, Ti and Cu. The material of the second bonding layer 114 can be SiO2 or transparent plastic/resin such as spin-on glass (SOG) or bonding adhesive Micro Resist BCL-1200. The light emitted from the first light emitting layer 111 can pass through the second bonding layer 114 for the second bonding layer 114 is transparent. Furthermore, because the second light emitting layer 112 also can be transparent, the first light emitted from the first light emitting layer 111 can pass through the second bonding layer 114 and the second light emitting layer 112. In one embodiment, the first bonding layer 113 and the second bonding layer 114 are non-metallic layers, and the first bonding layer 113 is transparent.

In this embodiment, the pixel 11 further includes an insulation layer 116. The insulation layer 116 covers the side wall of the first bonding layer 113, the first light emitting layer 111, the second bonding layer 114 and the second light emitting layer 112. Moreover, the insulation layer 116 also covers the surface of the substrate 110 and extends to the position between the pixels. In practice, the material of the insulation layer 116 can be dielectric thin-film materials such as SiNx and SiO2, or polymeric material such as polyamide (PA). Furthermore, the insulation layer 116 may be transparent. The insulation layer 116 can be formed on the pixel 11 by pasting, coating or CVD. Therefore, the insulation layer 116 prevents the first bonding layer 113, the first light emitting layer 111, the second bonding layer 114 and the second light emitting layer 112 from causing a short circuit. In this embodiment, the barrier component 12 is configured on the substrate 110, so that the insulation layer 116 covers the barrier component 12 and extends on the barrier component 12 between the pixels 11.

In this embodiment, the pixel 11 further includes a top conductive layer 117. The top conductive layer 117 is configured on the insulation layer 116, and extends to the position between the pixels 11. In practice, the material of the top conductive layer 117 can be Indium Tin Oxide (ITO), and the top conductive layer 117 can be formed on the insulation layer 116 commonly by vapor deposition. Furthermore, the top conductive layer 117 may be transparent. The top conductive layer 117 is configured to maintain a good conductivity for electrode connection. In this embodiment, the insulation layer 116 only covers the side wall of the second light emitting layer 112, and the top side of the second light emitting layer 112 is exposed. Therefore, when the top conductive layer 117 is disposed on the pixel, the top conductive layer 117 contacts and electrically connects to the top side of the second light emitting layer 112. Furthermore, the top conductive layer 117 can connect the top side of the second light emitting layer 112 of all pixels in series. It should be noted that the insulation layer 116 and the top conductive layer 117 not only cover two pixels 11 in FIG. 2, but also can extend to cover other pixels, which are represented by omitted lines herein.

Figure 3:
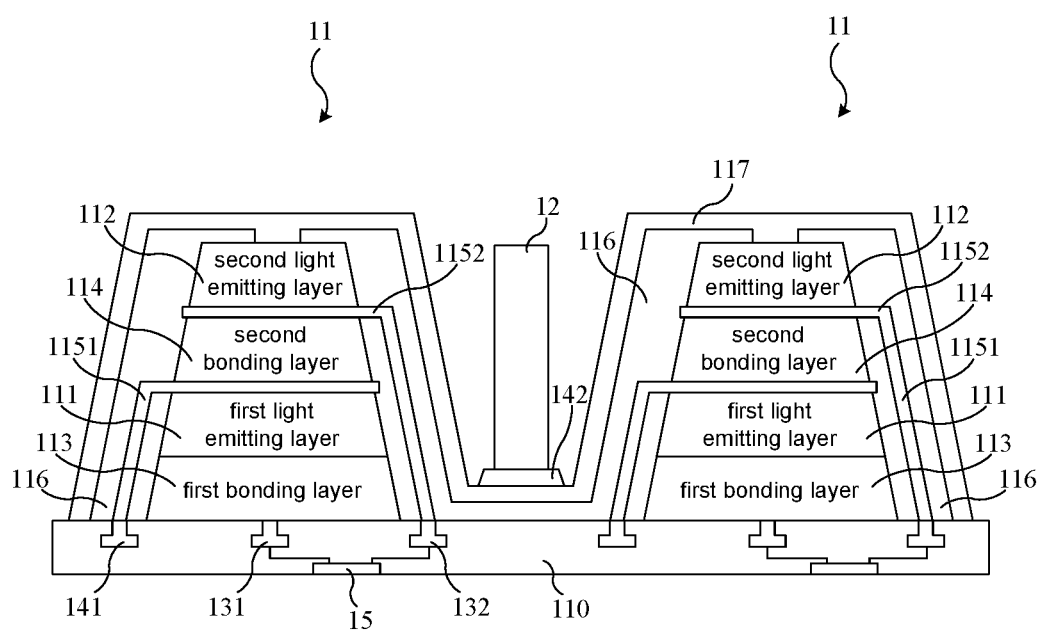
FIG. 3 is a cross-sectional diagram illustrating the two pixels of the double color micro LED display panel according to another embodiment of the present invention.
Figure 4:
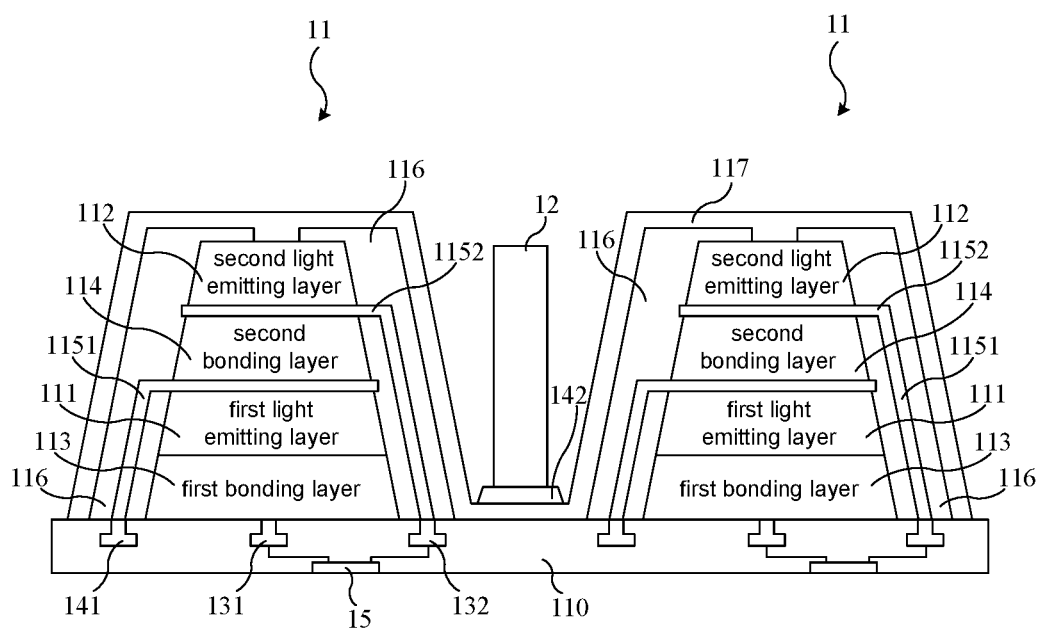
FIG. 4 is a cross-sectional diagram illustrating the two pixels of the double color micro LED display panel according to another embodiment of the present invention.

The configuration of the barrier component 12, the insulation layer 116 and the top conductive layer 117 also can be another form. Please refer to FIG. 3 and FIG. 4. FIG. 3 is a cross-sectional diagram illustrating the two pixels 11 of the double color micro LED display panel 1 according to another embodiment of the present invention. FIG. 4 is a cross-sectional diagram illustrating the two pixels 11 of the double color micro LED display panel 1 according to another embodiment of the present invention. As shown in FIG. 3, the barrier component 12 is configured on the top conductive layer 117. In this embodiment, the insulation layer 116 is disposed on the substrate 110, the top conductive layer 117 is disposed on the insulation layer 116, and then the barrier component 12 is disposed on the top conductive layer 117. In another one embodiment, as shown in FIG. 4, the insulation layer 116 not covers the position between the pixels 11, the top conductive layer 117 is disposed on the insulation layer 116 and extends to the position between the pixels 11. In this embodiment, the insulation layers 116 are disposed on the pixels 11 respectively, and the insulating effect can also be achieved. In the embodiments of FIG. 3 and FIG. 4, the top conductive layer 117 can connect all pixels in series by connecting the second light emitting layer 112 and the position between the pixels 11.

As shown in FIG. 3 and FIG. 4, the insulation layer 116 not only covers the side wall of the second light emitting layer 112, but also covers a portion of the top side of the second light emitting layer 112. That is to say, the portion of the second light emitting layer 112 which not covered by the insulation layer 116 is exposed. Similarly, the top conductive layer 117 can connect all pixels in series by connecting the uncovered portion of the second light emitting layer 112 and the position between the pixels 11.

Please refer to FIG. 2 again. In this embodiment, the sides of the first light emitting layer 111 and the second light emitting layer 112 are corresponding to the barrier component 12. In practice, because the insulation layer 116 and the top conductive layer 117 are transparent, the first light emitted from the first light emitting layer 111 and the second light emitted from the second light emitting layer 112 can pass through the insulation layer 116 and the top conductive layer 117. When the first light and the second light emitted from the side of the first light emitting layer 111 and the second light emitting layer 112 pass through the insulation layer 116 and the top conductive layer 117 to the barrier component 12, the barrier component 12 can block the first light and the second light to another of pixels 11.

In this embodiment, the barrier component 12 has an optical isolation structure. In practice, the optical isolation structure may include a light absorbing material formed on the surface of the optical isolation structure. Furthermore, the optical isolation structure also may be a metal component, and the light absorbing material coated on the surface of the metal component. The light absorbing material can absorb the certain wavelength of light or certain color. For example, the first light is a green light, and the second light is a blue light. The optical isolation structure can absorb the green light and the blue light. In one embodiment, two light absorbing materials are formed on the different positions of the optical isolation structure. The green light absorbing material is formed on the portion of the optical isolation structure corresponding to the first light emitting layer 111 to absorb the first light, and blue light absorbing material is formed on the portion of the optical isolation structure corresponding to the second light emitting layer 112 to absorb the second light. Therefore, the barrier component 12 can absorb and baffle the light emitted from the one of the pixels to another of the pixels to reduce the light crosstalk, thereby increasing the display efficiency and the resolution.

Figure 5:
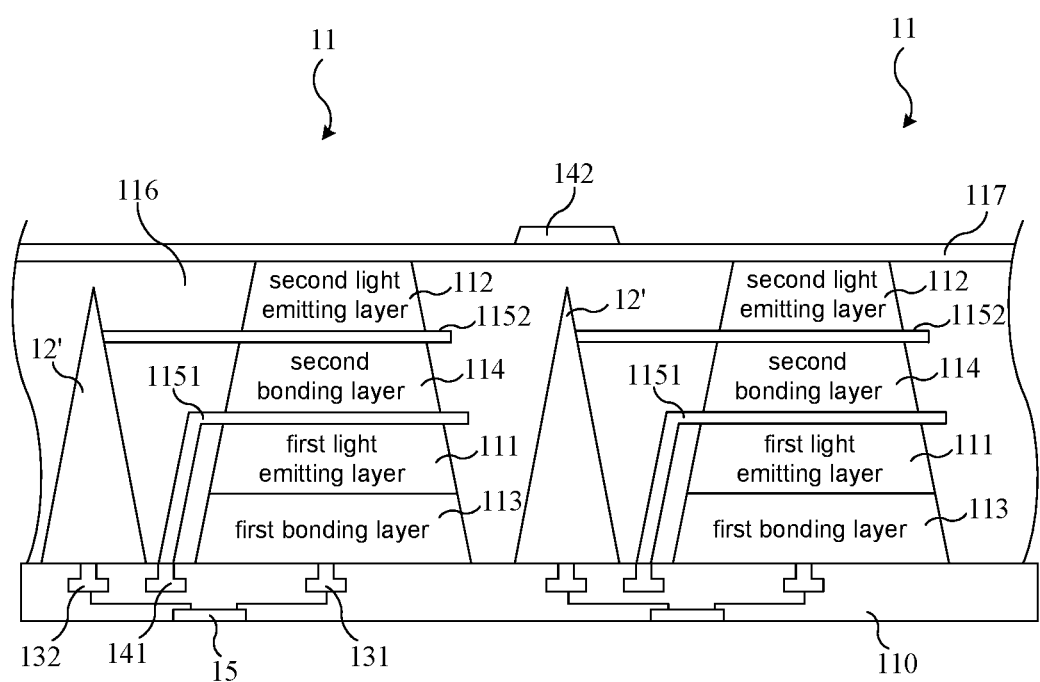
FIG. 5 is a cross-sectional diagram illustrating the two pixels of the double color micro LED display panel according to another embodiment of the present invention.

Please refer to FIG. 5. FIG. 5 is a cross-sectional diagram illustrating the two pixels 11 of the double color micro LED display panel 1' according to another embodiment of the present invention. In this embodiment, the barrier component 12' has a reflective structure. In practice, the reflective structure may be a triangular reflective prism. The surface of reflective structure facing to the first light emitting layer 111 and the second light emitting layer 112 can be formed a reflective layer to reflect the first light and the second light. Therefore, the barrier component 12' can reflect the light emitted from the one of the pixels to another of the pixels, thereby increasing the display efficiency. In addition, the reflective structure can reflect the first light and the second light to a certain direction according to the angle of the triangular prism. The certain direction can be perpendicular and away from the substrate. That is to say, the certain direction is the direction in which the pixel 11 emits light. As shown in FIG. 5, when the first light and the second light are emitted from the side of the first light emitting layer 111 and the second light emitting layer 112, the first light and the second light pass through the insulation layer 116 to the barrier component 12'. Then, the barrier component 12' changes the direction of the first light and the second light to make the first light and the second light pass through the insulation layer 116 and the top conductive layer 117 and emit light in the certain direction. Therefore, the barrier component 12' can change the direction of the first light and the second light to increase the light output rate, thereby increasing the display efficiency.

Figure 6:
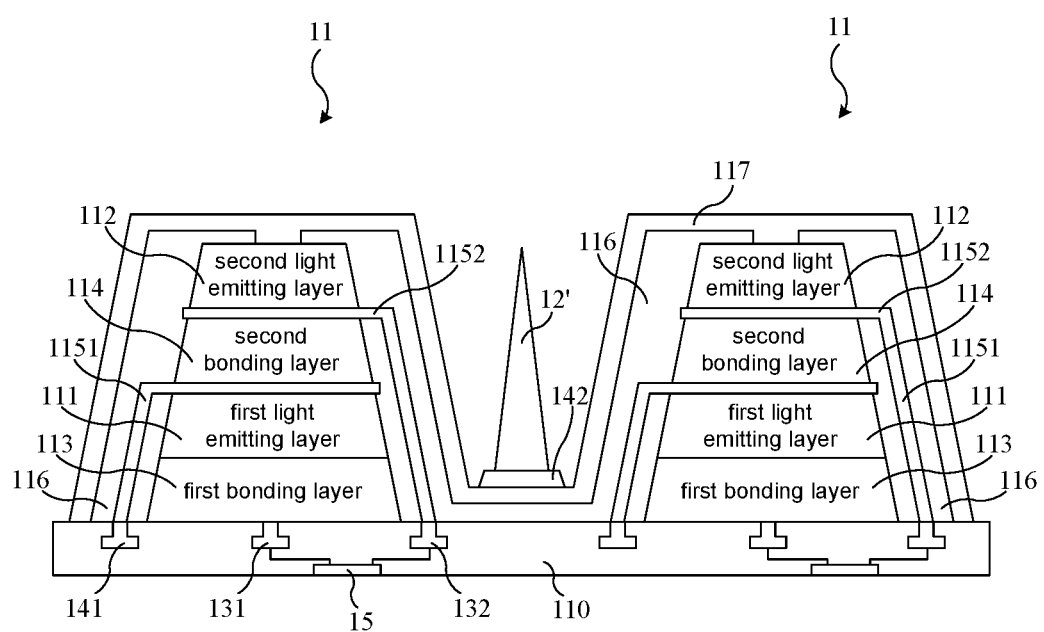
FIG. 6 is a cross-sectional diagram illustrating the two pixels of the double color micro LED display panel according to another embodiment of the present invention.

Please refer to FIG. 6. FIG. 6 is a cross-sectional diagram illustrating the two pixels 11 of the double color micro LED display panel 1' according to another embodiment of the present invention. In this embodiment, barrier component 12' is configured on the top conductive layer 117. Similarly, when the first light and the second light are emitted from the side of the first light emitting layer 111 and the second light emitting layer 112, the first light and the second light pass through the insulation layer 116 and the top conductive layer 117 to the barrier component 12'. Then, the barrier component 12' changes the direction of the first light and the second light to emit light in the certain direction.

Please refer to FIG. 2 again. In this embodiment, the pixel 11 includes a first anode pad 131, a second anode pad 132, a first cathode pad 141 and a second cathode pad 142. Furthermore, the pixel 11 includes a first connecting structure 1151 and a second connecting structure 1152. The first anode pad 131, the second anode pad 132 and the first cathode pad 141 are configured on the substrate 110, and the second cathode pad 142 is configured on the top conductive layer 117. The first connecting structure 1151 is configured on top side of the first light emitting layer 111, and the second connecting structure 1152 is configured at bottom side of the second light emitting layer 112. The first bonding layer 113 is electrically connected to the first anode pad 131, the second connecting structure 1152 is electrically connected to the second anode pad 132, and the first connecting structure 1151 is electrically connected to the first cathode pad 141. In practice, the first anode pad 131 and the second canoed pad 132 can be P-electrodes, and the first cathode pad 141 and the second cathode pad 142 can be N-electrodes or ground pads. The first connecting structure 1151 and the second connecting structure 1152 are made of conductive materials. Furthermore, the materials of the first connecting structure 1151 and the second connecting structure 1152 also may be Indium Tin Oxide (ITO).

In this embodiment, the double color micro LED display panel 1 further includes a plurality of pixel drivers 15 respectively configured on the substrate 110 of the pixels 11. The pixel driver 15 connects to the first anode pad 131 and the second anode pad 132. In practice, the pixel driver 15 can be a controlling chip. The pixel driver 15 can be connected to the positive electrode of a power source, and the second cathode pad 141 and the second cathode pad 142 can be connected to the negative electrode of the power source. When the pixel driver 15 apply the electricity to the first anode pad 131 and the second anode pad 132, the first anode pad 131 and the second anode pad 132 respectively provide electricity to the first bonding layer 113 and the second connecting structure 1152. Therefore, the first light emitting layer 111 can emit first light and the second light emitting layer 112 can emit the second light. Moreover, the pixel driver 15 can selectively control the first light emitting layer 111 and the second light emitting layer 112 to emit light.

In addition, as shown in FIG. 2, the second connecting structure 1152 can connect to the barrier component 12, and the barrier component 12 connects to the second anode pad 132 of the substrate 110. In practice, the barrier component 12 can be a metal structure or conductive structure, and then the second connecting structure 1152 also can be electrically connected to the second anode pad 132 through the barrier component 12. In one embodiment, the first bonding layer is non-metallic layer, and the pixel 11 includes a conductive layer (not shown in figure) configured between the first bonding layer 113 and the first light emitting layer 111. The conductive layer is electrically connected to the first anode pad 131 to provide electricity to the first light emitting layer 111. In practice, the first connecting structure 1151 and the second connecting structure 1152 can be configured along the shape of each layer to prevent from exposing out of the insulation layer and causing the short circuit, thereby increasing the safety and reducing the volume.

In one embodiment, the first connecting structure is configured on top side of the first light emitting layer and connects to the barrier component, the second connecting structure is configured at bottom side of the second light emitting layer and connects to the barrier component, and the barrier component is electrically connected to the second anode pad. In this embodiment, the first bonding layer is electrically connected to the cathode pad. Therefore, the second anode pad and the second light emitting layer can be electrically connected through barrier component and the second connecting structure, and the second anode pad and the first light emitting layer can be electrically connected through barrier component and the first connecting structure. Furthermore, the pixel driver can apply the circuit to the first light emitting layer and the second light emitting layer through the second anode pad and the barrier component, to make the first light emitting layer and the second light emitting layer emit light. The barrier component is also used as a metal reflective structure.

The configuration of the anode pads, the cathode pads, the first connecting structure 1151 and the second connecting structure 1152 also can be another form. As shown in FIG. 3, the second connecting structure 1152 is connected to the second anode pad 132 directly. In one embodiment, the pixel only includes one anode pad and one cathode pad, the first bonding layer and the second connecting structure are connected to the anode pad, and the first connecting structure and the top conductive layer are connected to the cathode pad.

Figure 7:
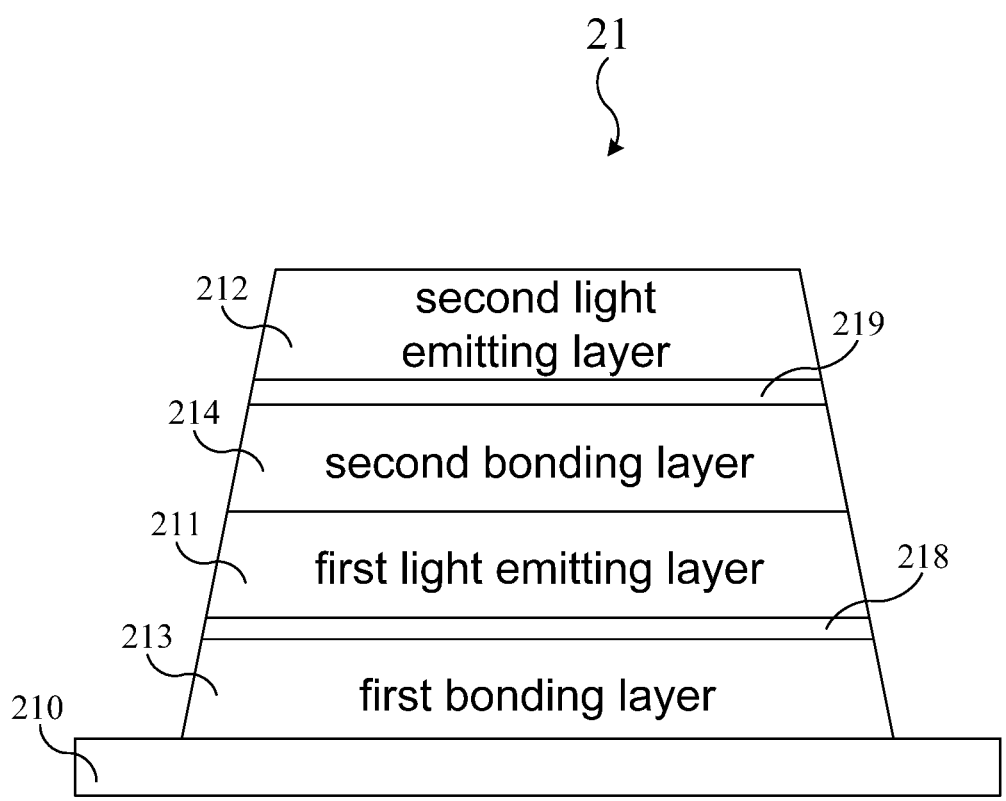
FIG. 7 is a cross-sectional diagram illustrating the pixel of the double color micro LED display panel according to another embodiment of the present invention.

Please refer to FIG. 7. FIG. 7 is a cross-sectional diagram illustrating the pixel 21 of the double color micro LED display panel 2 according to another embodiment of the present invention. In this embodiment, the pixel 21 further includes a first reflective layer 218 and a second reflective layer 219. The first reflective layer 218 is configured between the first bonding layer 213 and the first light emitting layer 211. The second reflective layer 219 is configured between the second bonding layer 214 and the second light emitting layer 212. In practice, the first reflective layer 218 can be coated on the first bonding layer 213 and the second reflective layer 219 can be coated on the second bonding layer 214. The materials of the first reflective layer 218 and the second reflective layer 219 can be a conductive material such as Ti3O5. Therefore, the first bonding layer 213 can still electrically connects to the first light emitting layer 211 through the first reflective layer 218, and the second bonding layer 214 can still electrically connects to the second light emitting layer 212 through the second reflective layer 219. Moreover, the first reflective layer 218 and the second reflective layer 219 can reflect certain wavelength of light to the certain direction respectively. For example, the first reflective layer 218 reflects the green light, and the second reflective layer 219 reflects the blue light. The certain direction is the same as the certain direction mentioned in the previous embodiments, which is not described herein. Therefore, the first reflective layer 218 and the second reflective layer 219 can respectively reflect other directions of the first light and the second light emitted from the first light emitting layer 211 and the second light emitting layer 212 to the certain direction to increase the light output rate, thereby increasing the display efficiency.

In summary, the double color micro LED display panel of the present invention can effectively block the light emitted from one pixel to another of pixels by the barrier component. The barrier component can be a reflective structure to increase the light output rate, which improves the display efficiency. The barrier component also can be an optical isolation structure to increase the resolution. The bonding layer between the light emitting layers can be transparent to increase the light output rate. Moreover, the pixel also can increase the light output rate by the reflective layer configured between the bonding layer and the light emitting layer.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A double color micro LED display panel, comprising:
a plurality of pixels, each of the pixels comprising:
   a substrate;
   a first bonding layer configured on the substrate;
   a first light emitting layer, configured on the first bonding layer and emitting a first light;
   a second bonding layer configured on the first light emitting layer;
   a first anode pad configured on the substrate and electrically connected to the first bonding layer;
   a first cathode pad configured on the substrate and electrically connected to an upper part of the first light emitting layer through a first connecting structure;
   a second light emitting layer, configured on the second bonding layer and emitting a second light, the wavelength of the second light being different from that of the first light;
   a second anode pad configured on the substrate and electrically connected to a bottom side of the second light emitting layer; and
a plurality of barrier components, respectively located between the pixels for blocking a light emitted from one of the pixels to the other of the pixels, one of the barrier components being electrically connected to a second connecting structure and the second anode pad in one of the pixels, thereby the second anode pad being electrically connected to the second light emitting layer through the barrier component and the second connecting structure;
wherein, the material of the second bonding layer is a non-metallic material.

2. The double color micro LED display panel of claim 1, wherein each of the pixels comprises an insulation layer, the insulation layer covers a side wall of the first bonding layer, the first light emitting layer, the second bonding layer, the second light emitting layer, and the surface of the substrate; a portion of the second light emitting layer is exposed, and the insulation layer extends to the position between the pixels.

3. The double color micro LED display panel of claim 2, wherein each of the pixels comprises a top conductive layer configured on the insulation layer and electrically connected to the exposed portion of the second light emitting layer; the top conductive layer extends to the position between the pixels, and a portion of the barrier components is configured on the top conductive layer.

4. The double color micro LED display panel of claim 3, further comprising a plurality of second cathode pads respectively configured on the top conductive layer and located between the pixels, and the barrier component covering the second cathode pad.

5. The double color micro LED display panel of claim 2, wherein the insulation layer further covers the barrier component.

6. The double color micro LED display panel of claim 5, wherein each of the pixels comprises a top conductive layer configured on the insulation layer, the top conductive layer extends to the position between the pixels, and the top conductive layer is separated from the barrier component by the insulation layer.

7. The double color micro LED display panel of claim 6, further comprising a plurality of second cathode pads respectively configured on the top conductive layer between the pixels and located above the barrier component.

8. The double color micro LED display panel of claim 1, wherein the barrier component has a reflective structure to reflect the first light emitted from the first light emitting layer to a certain direction.

9. The double color micro LED display panel of claim 1, wherein the barrier component has an optical isolation structure to baffle the first light emitted from the first light emitting layer.

10. The double color micro LED display panel of claim 1, wherein the second bonding layer is transparent, the first light emitted from the first light emitting layer propagates through the second bonding layer and the second light emitting layer.

11. The double color micro LED display panel of claim 1, further comprising a plurality of pixel drivers respectively configured on the substrate of the pixels, the first light emitting layer and the second light emitting layer being electrically connected to the pixel driver, and the pixel driver driving the first light emitting layer and the second light emitting layer to emit the first light and the second light respectively.

12. The double color micro LED display panel of claim 1, wherein each of pixels comprises an anode pad and a cathode pad configured on the substrate, one side of the second light emitting layer is electrically connected to the anode pad of the substrate, and one side of the first light emitting layer is electrically connected to the cathode pad of the substrate.

13. The double color micro LED display panel of claim 1, wherein each of the pixels comprises a first reflective layer configured between the first bonding layer and the first light emitting layer, and a second reflective layer configured between the second bonding layer and the second light emitting layer.

14. The double color micro LED display panel of claim 1, wherein the first light and the second light are selected from two of red, blue, yellow, green, orange, cyan and purple lights.

* * * * *